(12) United States Patent
Incarnati et al.

(10) Patent No.: US 7,639,534 B2
(45) Date of Patent: Dec. 29, 2009

(54) DEVICE, SYSTEM, AND METHOD OF BIT LINE SELECTION OF A FLASH MEMORY

(76) Inventors: Michele Incarnati, Via Calvario 5, Gioia dei Marsi (Aq) (IT) 67055; Giovanni Santin, Via Marche 3, Rieti (IT) 02010; Violante Moschiano, Via Nerva 91, Bacoli (IT) 80070; Tommaso Vali, Via Piagge Marine, Sezze (LT) (IT) 04018

( * ) Notice: Subject to any disclaimer, the term of this patent is extended or adjusted under 35 U.S.C. 154(b) by 122 days.

(21) Appl. No.: 11/860,949

(22) Filed: Sep. 25, 2007

(65) Prior Publication Data

US 2009/0080253 A1    Mar. 26, 2009

(51) Int. Cl.
   *G11C 16/04*   (2006.01)
   *G11C 5/06*    (2006.01)
(52) U.S. Cl. .............................. 365/185.05; 365/185.17; 365/185.18; 365/185.25
(58) Field of Classification Search ............. 365/185.17, 365/185.25, 189.02, 203, 204, 185.18, 185.05
See application file for complete search history.

(56) References Cited

U.S. PATENT DOCUMENTS

| | | | | |
|---|---|---|---|---|
| 6,480,419 | B2 * | 11/2002 | Lee ........................ | 365/185.18 |
| 6,584,005 | B1 * | 6/2003 | Kato et al. .................... | 365/63 |
| 2002/0054509 | A1 * | 5/2002 | Kurachi ................. | 365/185.18 |
| 2003/0174539 | A1 * | 9/2003 | Byeon et al. ........... | 365/185.21 |
| 2005/0226046 | A1 * | 10/2005 | Lee et al. ................ | 365/185.12 |
| 2007/0247908 | A1 * | 10/2007 | Aritome et al. ........ | 365/185.17 |

* cited by examiner

*Primary Examiner*—J. H. Hur
(74) *Attorney, Agent, or Firm*—Shiloh et al.

(57) ABSTRACT

Device, system, and method of bit line selection of a flash memory. In some demonstrative embodiments, the method may include connecting to ground at least one location along at least one bit line of a flash memory when the bit line is at an unselected state, wherein the bit line is connected to a multiplexer, and wherein at least one memory sector is coupled to the bit line between the multiplexer and the location; and connecting the location to a precharge path when the bit line is at a selected state.

14 Claims, 3 Drawing Sheets

DEVICE, SYSTEM, AND METHOD OF BIT LINE SELECTION OF A FLASH MEMORY

BACKGROUND

A flash memory may include a memory array, which may include a large number of floating gate memory cells arranged in a plurality of memory strings. Each of the memory cells may include a floating gate field-effect transistor capable of holding a charge. The memory strings may be associated with a plurality of bit lines. Each of the bit lines may be connected to a multiplexer, e.g., a write multiplexer.

During a read operation of the flash memory, some of the bit lines may be at a selected state and some of the bit lines may be at an unselected state. A bit line to bit line capacitance and a bit line to bit line resistance between a selected bit line and an unselected bit line may affect a precharge time and/or a sensing time of the selected bit line.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

In the following detailed description, numerous specific details are set forth in older to provide a thorough understanding of some embodiments. However, it will be understood by persons of ordinary skill in the art that embodiments of the invention may be practiced without these specific details. In other instances, well-known methods, procedures, components, units and/or circuits have not been described in detail so as not to obscure the discussion.

Discussions herein utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality" as used herein includes, for example, "multiple" or "two or more". For example, "a plurality of items" includes two or more items.

Some embodiments may be used in conjunction with various devices and systems, for example, a memory module, a removable memory, a portable memory, a non-volatile memory, a universal Serial Bus (USB) memory device, a memory card, Personal Computer (PC), a desktop computer, a mobile computer, a laptop computer, a notebook computer, a tablet computer, a server computer, a handheld computer, a handheld device, a Personal Digital Assistant (PDA) device, a handheld PDA device, an on-board device, an off-board device, a hybrid device, a vehicular device, a non-vehicular device, a mobile or portable device, a non-mobile or non-portable device, one way and/or two-way radio communication systems, cellular radio-telephone communication systems, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a wired or wireless handheld device (e.g., BlackBerry, Palm Treo), a Wireless Application Protocol (WAP) device, or the like.

Figure 1:
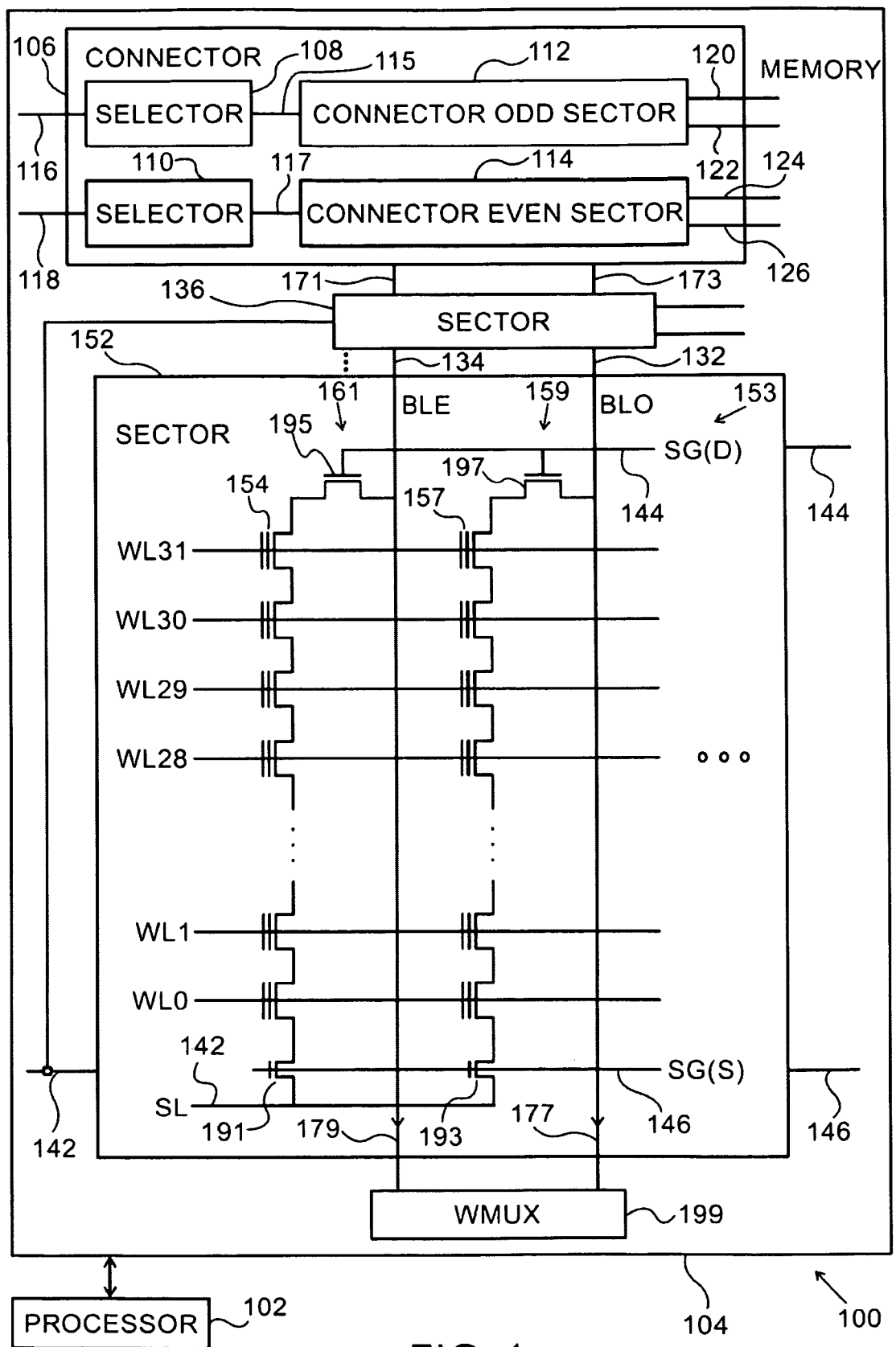
FIG. 1 is a schematic block diagram illustration of a computing device in accordance with some demonstrative embodiments.

FIG. 1 schematically illustrates a block diagram of a computing device 100 in accordance with some demonstrative embodiments.

In some demonstrative embodiments, device 100 may include a flash memory 104, Flash memory 104 may include, for example, a NAND flash memory, e.g., as described below. Although some demonstrative embodiments are described herein with respect to a NAND flash memory, embodiments of the invention are not limited in this respect. For example, other embodiments may relate to a NOR flash memory or an AND flash memory.

Device 100 may be or may include, for example, a memory device, a removable memory device, a portable memory device, a USB memory device, a memory card, a PC, a desktop computer, a mobile computer, a laptop computer, a notebook computer, a tablet computer, a server computer, a handheld computer, a handheld device, a PDA device, a handheld PDA device, an on-board device, a mobile phone, a cellular phone, a computing device, a computer, a PC, a server computer, a client/server system, a desktop computer, a mobile computer, a portable computer, a laptop computer, a notebook computer, a tablet computer, a network of multiple interconnected devices, a handheld computer, a handheld device, a PDA device, a handheld PDA device, an on-board device, an off-board device, a hybrid device, a vehicular device, a non-vehicular device, a mobile or portable device, a non-mobile or non-portable device, or the like.

In some demonstrative embodiments, device 100 may also include, for example, a processor 102. Device 100 may optionally include any other suitable hardware components and/or software components Processor 102 includes, for example, a Central Processing Unit (CPU), a Digital Signal Processor (DSP), one or more processor cores, a single-core processor, a dual-cote processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processor 102 process, for example, data stored by memory 104.

In some embodiments, some or all of the components of device 100 may be enclosed in a common housing, packaging, or the like, and may be interconnected or operably associated using one or more wired or wireless links. In other embodiments, components of device 100 may be described among multiple or separate devices or locations.

In some demonstrative embodiments, memory 104 may include a plurality of flash memory sectors, e.g., including flash memory sectors 136 and 152, coupled to a plurality of bit lines, for example, including a plurality of pairs of bit lines, e.g., including an even bit line (ble) 134 and an odd bit line (blo) 132, as described in detail below.

In some demonstrative embodiments, memory 104 may include a connector 106 to connect at least one location along at least one bit line of the plurality of bit lines to ground when the bit line is at an unselected state, and to connect the location of the bit line to a precharge path having a precharge voltage, denoted pchgv, when the bit line is at a selected state, e.g., as described in detail below. The bit lines may be at the selected or unselected states during, for example, a read operation performed to memory 104. In some demonstrative embodiments, the at least one location along the bit line may include a free end of a bit line, e.g., a first end or a portion of the bit line proximate to the first end of the bit line. In other embodiments, the location may include any suitable location along the bit line wherein, for example, at least one memory sector is coupled to the bit line between the location and a multiplexer. For example the location may be substantially at the middle of the bit line, at a quarter of the bit line, between two memory sectors coupled to the bit line, and or any other suitable location along the bit line. In some embodiments, the multiplexer may be connected to a second end of the bit line. For example, the multiplexer may include a write multiplexer (WMUX), which may be used to couple the bit line to a sense amplifier.

In some demonstrative embodiments, connector 106 may be capable of connecting an end 173 of blo 132 to ground and an end 171 of ble 134 to the precharge path, when ble 134 is at the selected state; and connecting end 173 of blo 132 to the precharge path and end 171 of ble 134 to ground, when blo 132 is at the selected state, e.g., as described below In other embodiments, connector 106 may be capable of selectively connecting to ground or the precharge path any other one or more locations along bit lines 132 and/or 134. In one example, connector 106 may be capable of selectively connecting to ground or the precharge path a location along bit lines 132 and 134 between sector 136 and sector 152.

In some demonstrative embodiments, connecting the unselected bit line to ground, e.g., via the at least one location along the bit line, may reduce a bit line to bit line capacitance and or resistance (BLRC) seen by a selected memory block. Connecting the selected bit line to the precharge path, e.g., via the free end of the bit line, may reduce a precharge time of the selected bit line. Connecting the unselected bit line to ground, e.g., via the free end of the bit line, may improve the driving to ground of the unselected bit line.

In some demonstrative embodiments, connector 106 may be capable of selectively connecting the location along the bit line to the precharge path or ground based, for example, on a value of a selection line connected to the bit line. For example, connector 106 may be capable of selectively connecting end 171 of ble 134 to the precharge path or ground based, for example, on a value of a selection line 118; and/or selectively connecting end 173 of blo 132 to the precharge path or ground based, for example, on a value of a selection line 116, e.g., as described below.

In some demonstrative embodiments, each of flash memory sectors 136 and 152 may include a NAND memory array 153, which may include a plurality of memory strings associated with the plurality of bit lines. For example, memory array 153 may include a memory string 161 coupled to ble 134, e.g., between end 171 and a second end 179 of bit line 134; and a memory string 159 coupled to blo 132, e.g., between end 173 and second end 177 of bit line 132. End 177 of ble 134 and end 179 of blo 132 may be connected to a WMUX 199, which may couple ble 134 and/or blo 132 to a sense amplifier (not shown). Memory strings 161 and 159 may include arrays of floating gate cells 154 and 157, respectively, coupled drain to source A plurality of word lines WL0-WL31, which span across memory strings 161 and 159, are coupled to control gates of every floating gate cell in a row in order to control operation of the floating gate cells. String 161 may be coupled to a source line 142 by a source select gate 191, and to ble 134 by a drain select gate 195. String 159 may be coupled to source line 142 by a source select gate 193, and to blo 132 by a drain select gate 197. Source select gates 191 and 193 are controlled by a source select gate control line SG(S) 146, which may be coupled to control gates of source select gates 191 and 193, Drain select gates 195 and 197 may be controlled by a drain select gate control line SG(D) 144.

In some demonstrative embodiments, a memory array of sector 136 may be controlled according to source line 142.

In some demonstrative embodiments, connector 106 may include at least one connector sector coupled to at least one bit line of the plurality of bit lines; and at least one selector to selectively connect a source line of the connector sector to the precharge path or ground based on the state of the bit line, e.g., as described below.

In some demonstrative embodiments, connector 106 may include a connector odd sector 112 to selectively connect a plurality of odd bit lines of memory 104, e.g., end 173 of blo 132, to ground, e.g., when the odd bit lines are at the unselected state; or to the precharge path, e.g., when the odd bit lines are at the selected state. For example, connector 106 may also include a selector 108 to selectively connect a source line 115 of sector 112 to the precharge path or ground based on the value of selection line 116, e.g., as described below.

In some demonstrative embodiments, connector 106 may include a connector even sector 114 to selectively connect a plurality of even bit lines of memory 104, e.g., end 171 of ble 134, to ground, e.g., when the even bit lines are at the unselected state; or to the precharge path, e.g., when the even bit lines are at the selected state. For example, connector 106 may also include a selector 110 to selectively connect a source line 117 of sector 114 to the precharge path or ground based on the value of selection line 118 e.g., as described below.

In some demonstrative embodiments, sectors 112 and 114 may be implemented by first and second flash memory sectors, for example, including architecture similar to the architecture of flash memory sectors 136 and 152, e.g., as described below with reference to FIG. 2. Implementing sectors 112 and 114 by flash memory sectors may have a relatively low impact on a die size of memory 104.

In some demonstrative embodiments, sector 112 may include a source select gate control line 122 and a drain select gate control line 120, e.g., analogous to lines 146 and 144, respectively. Sector 114 may include a source select gate control line 126 and a drain select gate control line 124, e.g., analogous to lines 146 and 144, respectively.

Figure 2:
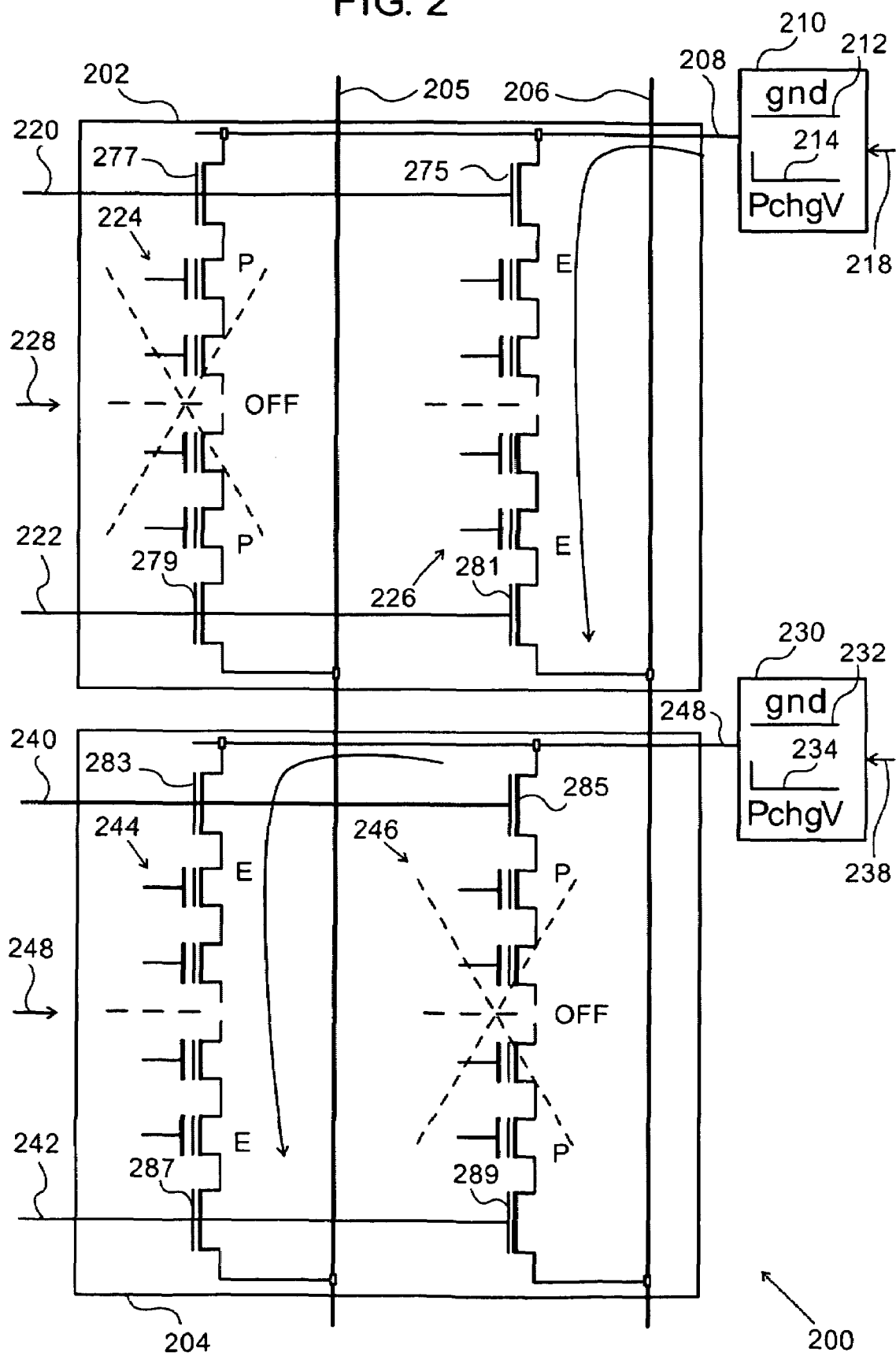
FIG. 2 is a schematic block diagram illustration of a bit line connector in accordance with some demonstrative embodiments.

Reference is now made to FIG. 2, which schematically illustrates a bit line connector 200 in accordance with some demonstrative embodiments. Although embodiments of the invention are not limited in this respect, in some demonstrative embodiments connector 200 may perform the functionality of connector 106 (FIG. 1).

In some demonstrative embodiments, bit line connector 200 may include a first connector sector 202 and a second connector sector 204. Although embodiments of the invention are not limited in this respect, in some demonstrative embodiments connector sectors 202 and/or 204 may perform the functionality of connector sectors 112 and/or 114 (FIG. 1), respectively.

In some demonstrative embodiments, sector 202 may include a first plurality of floating gate cells 226 coupled to a source line 208 via a source select gate 275, and coupled to a blo 206 via a drain select gate 281. Sector 202 may also include a second plurality of floating gate cells 224 coupled to source line 208 via a source select gate 277, and coupled to a ble 205 via a drain select gate 279. Floating gate cells 226 may have a threshold voltage, denoted $V_{TE}$, which may be lower than a predefined voltage, for example, zero, e.g., $V_{TE}<0$. Floating gate cells 224 may have a threshold voltage, denoted $V_{TP}$, which may be higher than the predefined voltage, e.g., $V_{TP}>0$. Source select gates 275 and 277 may be controlled by a source select gate control line SG(S) 220; and drain select gates 279 and 281 may be controlled by a drain select gate control line SG(D) 222. Control lines 220 and 222 may be coupled, for example, to control lines 122 (FIG. 1) and 120 146 and 144 (FIG. 1), respectively.

In some demonstrative embodiments, a plurality of word lines 228 may be coupled to control gates of the plurality of floating gate cells 224, respectively, and to control gates of the plurality of floating gate cells 226, respectively. Word lines 228 may be driven to the predefined voltage, e.g., zero.

In some demonstrative embodiments, bit line connector 200 may also include a selector 210 to connect source line 208 to a precharge path 214 having the precharge voltage pchgv, or to ground 214, based on a selection signal 218. Selection signal 218 may have a value corresponding, for example, to a state of blo 206. For example, selection signal 218 may have value of one when blo 206 is at the selected state, and a value of zero when blo 206 is at the unselected state. In one example, selection signal 218 may be associated with signal 116 (FIG. 1). Selector 210 may connect source line 208 to precharge path 214, e.g., when signal 218 has a value of one; and to ground 212, e.g., when signal 218 has a value of zero.

In some demonstrative embodiments, control lines 220 and 222 may be driven to a predefined read voltage, denoted $V_{read}$, for example, during a read operation. Signal 218 may have a value of one, e.g., if blo 206 is selected during the read operation. Accordingly, source line 208 may be connected by selector 210 to precharge path 214. As a result, blo 206 may be connected to precharge path 214, e.g., via floating gate cells 226. Signal 218 may have a value of zero, e.g., if blo 206 is unselected during the read operation. Accordingly, source line 208 may be connected by selector 210 to ground 212. As a result, blo 206 may be connected to ground 212, e.g., via floating gate cells 226.

In some demonstrative embodiments, sector 204 may include a first plurality of floating gate cells 244 coupled to a source line 248 via a source select gate 283, and coupled to ble 205 via a drain select gate 287. Sector 202 may also include a second plurality of floating gate cells 246 coupled to source line 208 via a source select gate 285, and coupled to blo 206 via a drain select gate 289, Floating gate cells 244 may have the threshold voltage $V_{TE}$, and floating gate cells 246 may have the threshold voltage $V_{TP}$. Source select gates 283 and 285 may be controlled by a source select gate control line SG(S) 240; and drain select gates 287 and 289 may be controlled by a drain select gate control line SG(D) 242. Control lines 240 and 242 may be coupled, for example, to control lines 126 (FIG. 1) and 124 (FIG. 1), respectively.

In some demonstrative embodiments, a plurality of word lines 248 may be coupled to control gates of the plurality of floating gate cells 244, respectively, and to control gates of the plurality of floating gate cells 246, respectively. Word lines 248 may be driven to the predefined voltage, e.g., zero.

In some demonstrative embodiments, bit line connector 200 may also include a selector 230 to connect source line 248 to a precharge path 234 having the precharge voltage pchgv, or to ground 232, based on a selection signal 238. Selection signal 238 may have a value corresponding, for example, to a state of ble 205. For example, selection signal 238 may have value of one when ble 205 is at the selected state, and a value of zero when ble 205 is at the unselected state. In one example, selection signal 238 may be associated with signal 118 (FIG. 1). Selector 230 may connect source line 238 to precharge path 234, e.g., when signal 238 has a value of one; and to ground 232, e.g., when signal 238 has a value of zero.

In some demonstrative embodiments, control lines 240 and 242 may be driven to the read voltage $V_{read}$ for example, during the read operation. Signal 238 may have a value of zero, e.g., if ble 205 is unselected during the read operation. Accordingly, source line 248 may be connected by selector 230 to ground 232. As a result, ble 205 may be connected to ground 232, e.g., via floating gate cells 244. Signal 238 may have a value of one, e.g., if ble 205 is selected during the read operation. Accordingly, source line 248 may be connected by selector 230 to precharge path 234. As a result, ble 205 may be connected to precharge path 234, e.g., via floating gate cells 244.

Figure 3:
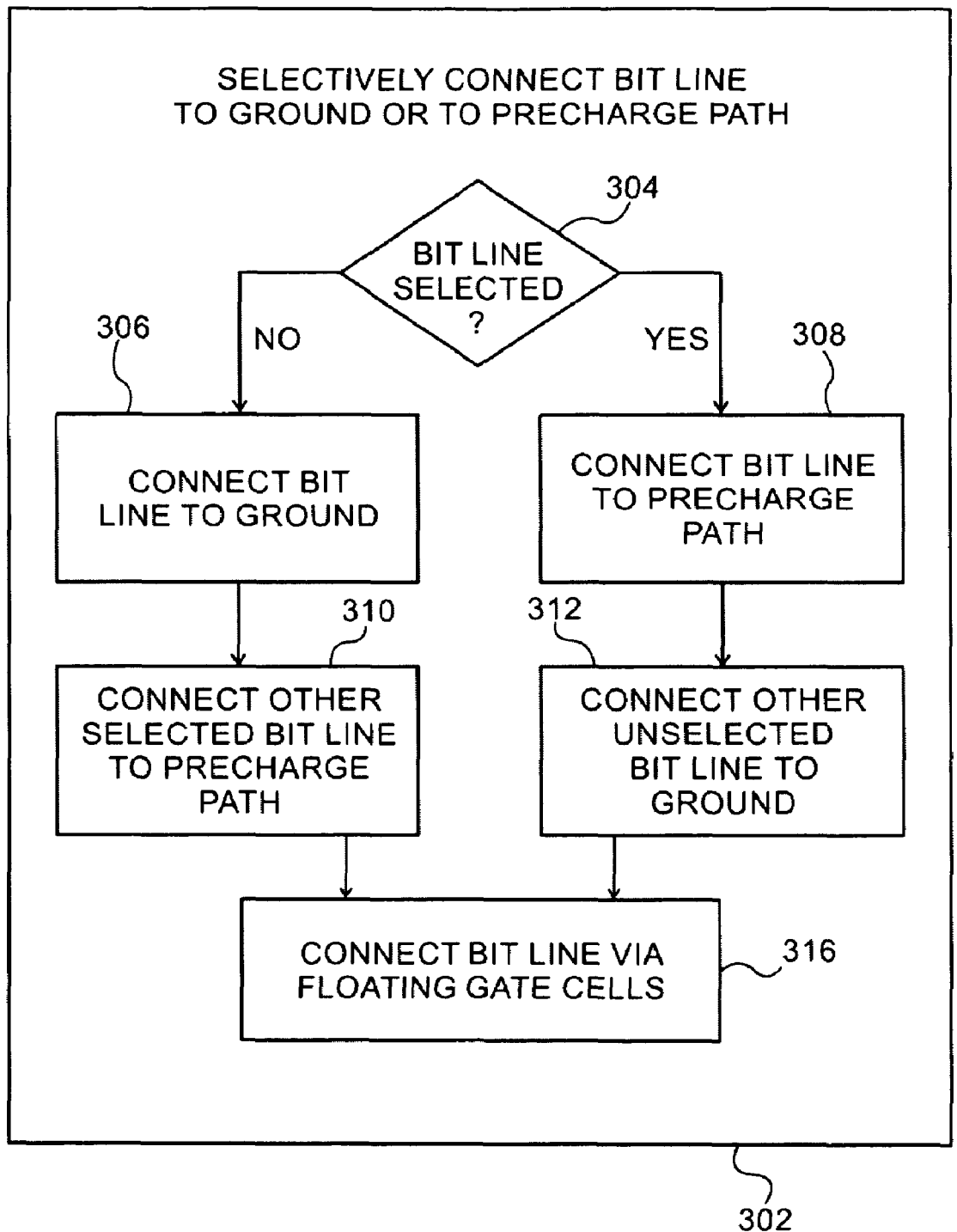
FIG. 3 is a schematic flow-chart illustration of a method of bit line selection of a flash memory in accordance with some demonstrative embodiments.

Reference is now made to FIG. 3, which schematically illustrates a method of bit line selection in accordance with some demonstrative embodiments. Although embodiments of the invention are not limited in this respect, in some demonstrative embodiments one or more operations of the method of FIG. 3 may be performed by memory 104 (FIG. 1), and/or by connector 106 (FIG. 1), e.g., during a read operation of memory 104 (FIG. 1).

As indicated at block 302, the method may include selectively connecting at least one location along at least one bit line, e.g., a first end of the bit line, of a flash memory to ground or to a precharge path, e.g., during a read operation. The bit line may be connected to a WMUX, e.g., at a second end of the bit line as described above. The at least one bit line may include, for example, at least one bit line coupled to a plurality of flash memory sectors, each of the sectors including a plurality of floating gate cells coupled to a plurality of word lines, respectively. For example, connector 106 (FIG. 1) may selectively connect end 171 (FIG. 1) of ble 134 (FIG. 1) and/or end 173 (FIG. 1) of blo 132 (FIG. 1) to ground or to the precharge path, e.g., as described above.

As indicated at block 304, the method may include selectively connecting the location to the precharge path or ground, based on a value of a selection line connected to the bit line.

As indicated at block 306, the method may include connecting the location to ground when the bit line is at an unselected state. As indicated at block 310, the method may include connecting at least one location along another bit line at a selected state to the precharge path. For example, a first location along an odd bit line of a pair of bit lines may be connected to ground and a second location along an even bit line of the pair of bit lines may be connected to the precharge path, when the even bit line is at the selected state. Each of the even and odd bit lines may be connected to a WMUX, e.g., as described above.

As indicated at block 308, method may include connecting the location to the precharge path when the bit line is at a selected state. As indicated at block 312, the method may include connecting at least one location along another bit line at an unselected state to ground. For example, the first location of the odd bit line may be connected to the precharge path and the second location of the even bit line may be connected to the ground, when the odd bit line is at the selected state.

As indicated at block 316, the method may include connecting the location to ground via a first plurality of floating gate cells of a flash memory sector; and/or connecting the location to the precharge path via a second plurality of floating gate cells.

Other suitable operations may be used, and other suitable orders of operation may be used.

Some embodiments, for example, may take the form of an entirely hardware embodiment, an entirely software embodiment, or an embodiment including both hardware and software elements. Some embodiments may be implemented in software, which includes but is not limited to firmware, resident software, microcode, or the like.

In some embodiments, a data processing system suitable for storing and/or executing program code may include at least one processor coupled directly or indirectly to memory elements, for example, through a system bus. The memory elements may include, for example, local memory employed during actual execution of the program code, bulk storage, and cache memories which may provide temporary storage of at least some program code in order to reduce the number of times code must be retrieved from bulk storage during execution.

In some embodiments, input/output or I/O devices (including but not limited to keyboards, displays, pointing devices, etc.) may be coupled to the system either directly or through intervening I/O controllers. In some embodiments, network adapters may be coupled to the system to enable the data processing system to become coupled to other data processing systems or remote printers or storage devices, for example, through intervening private or public networks. In some embodiments, modems, cable modems and Ethernet cards are demonstrative examples of types of network adapters. Other suitable components may be used.

Functions, operations, components and/or features described herein with reference to one or more embodiments, may be combined with, or may be utilized in combination with, one or more other functions, operations, components and/or features described herein with reference to one or more other embodiments, or vice versa.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

What is claimed is:

1. A method comprising:
    connecting to ground at least one location along at least one bit line of a flash memory when said bit line is at an unselected state, wherein said bit line is connected to a multiplexer, and wherein at least one memory sector is coupled to said bit line between said multiplexer and said location; and
    connecting said location to a precharge path when said bit line is at a selected state,
    wherein at least one of connecting the location to ground and connecting the location to the precharge path includes connecting the location via a plurality of floating gate cells of at least one flash memory sector.

2. The method of claim 1 comprising selectively connecting the location to said precharge path or ground, based on a value of a selection line connected to said bit line.

3. The method of claim 2, wherein said at least one bit line comprises at least one pair of bit lines, and wherein said selectively connecting comprises:
    connecting a first location along an odd bit line of said pair of bit lines to ground and a second location along an even bit line of said pair of bit lines to said precharge path, when said even bit line is at said selected state; and
    connecting the first location to said precharge path and the second location to ground, when said odd bit line is at said selected state.

4. The method of claim 1, wherein connecting said location to ground comprises connecting said location to ground via the plurality of floating gate cells of the flash memory sector.

5. The method of claim 1, wherein connecting said location to said precharge path comprises connecting said location to said precharge path via the plurality of floating gate cells of the flash memory sector.

6. The method of claim 1, wherein said sector comprises a plurality of floating gate cells coupled to a plurality of word lines, respectively.

7. The method of claim 1, wherein connecting said location to ground and connecting said location to said precharge path comprise connecting said location to ground and connecting said location to said precharge path during a flash memory read operation.

8. A flash memory comprising:
    a plurality of flash memory sectors coupled to a plurality of bit lines; and
    a bit line connector to connect at least one location along at least one bit line of said plurality of bit lines to ground when said bit line is at an unselected state, and to connect said location to a precharge path when said bit line is at a selected state, wherein at least one of said memory sectors is coupled to said bit line between a multiplexer and said location,
    wherein said connector comprises:
        at least one connector flash memory sector coupled to said bit line; and
        at least one selector to selectively connect a source line of said connector flash memory sector to said precharge path or ground based on the state of said bit line.

9. The flash memory of claim 8, wherein said connector sector comprises a plurality of floating gate cells coupled to said bit line via a source select gate and a drain select gate.

10. The flash memory of claim 9, wherein said plurality of floating gate cells are coupled to a plurality of word lines, and wherein said plurality of word lines arc driven to a predefined voltage.

11. The flash memory of claim 10, wherein said predefined voltage is zero.

12. The flash memory of claim 9, wherein said at least one connector sector comprises first and second connector sectors,
    wherein said first connector sector comprises a first plurality of floating gate cells coupled to an odd bit line and having a threshold voltage lower than said predefined voltage, and a second plurality of floating gate cells coupled to an even bit line and having a threshold voltage higher than said predefined voltage, and
    wherein said second connector sector comprises a third plurality of floating gate cells coupled to said odd bit line and having a threshold voltage higher than said predefined voltage, and a fourth plurality of floating gate cells coupled to said even bit line and having a threshold voltage lower than said predefined voltage.

13. The flash memory of claim 12, wherein said at least one selector comprises:
    a first selector to connect a source line of said first connector sector to said precharge path when said odd bit line is at said selected state, and to ground when said odd bit line is at said unselected state; and
    a second selector to connect a source line of said second connector sector to said precharge path when said even bit line is at said selected state, and to ground when said even bit line is at said unselected state.

14. The flash memory of claim 8, wherein said connector is capable of selectively connecting the first end of said bit line to said precharge path or ground, based on a value of a selection line connected to said bit line.

* * * * *

UNITED STATES PATENT AND TRADEMARK OFFICE
CERTIFICATE OF CORRECTION

PATENT NO.         : 7,639,534 B2                                                              Page 1 of 1
APPLICATION NO.    : 11/860949
DATED              : December 29, 2009
INVENTOR(S)        : Michele Incarnati et al.

It is certified that error appears in the above-identified patent and that said Letters Patent is hereby corrected as shown below:

On the Title page, in field (76), in column 1, in "Inventors", line 5, after "Bacoli" insert -- (NA) --.

In column 8, line 28, in Claim 10, delete "arc" and insert -- are --, therefor.

Signed and Sealed this

Sixteenth Day of March, 2010

David J. Kappos
*Director of the United States Patent and Trademark Office*